United States Patent [19]

Johncock et al.

[11] Patent Number: 4,619,729
[45] Date of Patent: * Oct. 28, 1986

[54] MICROWAVE METHOD OF MAKING SEMICONDUCTOR MEMBERS

[75] Inventors: Annette G. Johncock, Royal Oak; Stephen J. Hudgens, Southfield, both of Mich.

[73] Assignee: Energy Conversion Devices, Inc., Troy, Mich.

[*] Notice: The portion of the term of this patent subsequent to Apr. 15, 2003 has been disclaimed.

[21] Appl. No.: 734,576

[22] Filed: May 15, 1985

Related U.S. Application Data

[63] Continuation-in-part of Ser. No. 580,081, Feb. 14, 1984.

[51] Int. Cl.⁴ ............................................. C30B 25/02
[52] U.S. Cl. ..................................... 156/606; 427/39; 427/74; 156/613
[58] Field of Search .............. 156/613, 610, DIG. 89, 156/606; 148/175, DIG. 57; 422/199, 245; 430/65, 67, 85, 86, 132, 133, 135; 204/164; 427/39, 74

[56] References Cited

U.S. PATENT DOCUMENTS

| | | | |
|---|---|---|---|
| 4,359,514 | 11/1982 | Shimizu et al. | 427/39 |
| 4,394,425 | 7/1983 | Shimizu et al. | 430/65 |
| 4,394,426 | 7/1983 | Shimizu et al. | 427/74 |
| 4,439,463 | 3/1984 | Miller | 427/39 |
| 4,443,488 | 4/1984 | Little et al. | 156/613 |
| 4,464,415 | 8/1984 | Yamazaki | 427/74 |
| 4,481,229 | 11/1984 | Suzuki et al. | 427/38 |
| 4,483,911 | 11/1984 | Ogawa et al. | 430/65 |
| 4,517,223 | 5/1985 | Ovshinsky et al. | 427/39 |

OTHER PUBLICATIONS

McGraw-Hill Dictionary of Scientific and Technical Terms, 3rd Ed. N.Y., 1983.

Primary Examiner—Hiram H. Bernstein
Attorney, Agent, or Firm—Marvin S. Siskind; Ronald W. Citkowski

[57] ABSTRACT

A process and system for making semiconductor alloys and members with high reaction gas conversion efficiencies and at high deposition rates utilizes microwave energy to form a deposition plasma. The microwave energy forms depositing species and molecular ions of a semiconductor element and the potential of the plasma is controlled to alter the ion bombardment of the depositing species.

The process and system include coupling microwave energy into a substantially enclosed reaction vessel containing a substrate and depositing semiconductor alloys onto the substrate from a reaction gas introduced into the vessel. The semiconductor alloys are particularly suited for relatively thick photoconductive members. The photoconductive member includes at least a bottom blocking layer and a photoconductive layer. The photoconductive member can be formed in a negative or positive charge type configuration. The members also can include a top blocking enhancement layer.

18 Claims, 5 Drawing Figures

MICROWAVE METHOD OF MAKING SEMICONDUCTOR MEMBERS

RELATED APPLICATION

This is a continuation-in-part of copending application Ser. No. 580,081, filed Feb. 14, 1984, entitled "An Improved Method Of Making A Photoconductive Member And Improved Photoconductive Members Made Thereby".

BACKGROUND OF THE INVENTION

This invention relates to an improved microwave glow discharge system and method of making semiconductor alloys and members by controlling ion bombardment of the depositing material. The process provides both a commercially viable reaction gas conversion efficiency and a commercially viable deposition rate. The invention most particularly relates to a system and method of making relatively thick photoconductive alloys and members by microwave plasma deposition of a selected reaction gas or gases. Further, photoconductive members having an enhanced top blocking layer can be formed. The photoconductive members can be formed to accept either a positive or a negative charge.

Silicon is the basis of the huge crystalline semiconductor industry and is the material which has produced expensive high efficiency (18 percent) crystalline solar cells for space applications. When crystalline semiconductor technology reached a commercial state, it became the foundation of the present huge semiconductor device manufacturing industry. This was due to the ability of the scientists to grow substantially defect-free germanium and particularly silicon crystals, and then turn them into extrinsic materials with p-type and n-type conductivity regions therein. This was accomplished by diffusing into such crystalline material parts per million of donor (n) or acceptor (p) dopant materials introduced as substitutional impurities into the substantially pure crystalline materials, to increase their electrical conductivity and to control their being either of a p or n conduction type. The fabrication processes for making p-n junction crystals involve extremely complex, time consuming, and expensive procedures. Thus, these crystalline materials useful in solar cells and current control devices are produced under very carefully controlled conditions by growing individual single silicon or germanium crystals, and when p-n junctions are required, by doping such single crystals with extremely small and critical amounts of dopants.

In summary, crystal silicon devices have fixed parameters which are not variable as desired, require large amounts of material, are only producible in relatively small areas and are expensive and time consuming to produce. Devices based upon amorphous silicon can eliminate these crystal silicon disadvantages. Amorphous silicon has an optical absorption edge having properties similar to a direct gap semiconductor and only a material thickness of one micron or less is necessary to absorb the same amount of sunlight as the 50 micron thick crystalline silicon. Further, amorphous silicon can be made faster, easier and in larger areas than can crystalline silicon.

Accordingly, a considerable effort has been made to develop processes for readily depositing amorphous semiconductor alloys or films, each of which can encompass relatively large areas, if desired, limited only by the size of the deposition equipment, and which could be readily doped to form p-type and n-type materials where p-n junction devices are to be made therefrom equivalent to those produced by their crystalline counterparts. For many years such work was substantially unproductive. Amorphous silicon or germanium (Group IV) films are normally four-fold coordinated and were found to have microvoids and dangling bonds and other defects which produce a high density of localized states in the energy gap thereof. The presence of a high density of localized states in the energy gap of amorphous silicon semiconductor films results in a low degree of photoconductivity and short carrier lifetime, making such films unsuitable for photoresponsive applications. Additionally, such films could not be successfully doped or otherwise modified to shift the Fermi level close to the conduction or valence bands, making them unsuitable for making p-n junctions for solar cell and current control device applications.

In an attempt to minimize the aforementioned problems involved with amorphous silicon and germanium, W. E. Spear and P. G. Le Comber of Carnegie Laboratory of Physics, University of Dundee, in Dundee, Scotland, did some work on "Substitutional Doping of Amorphous Silicon", as reported in a paper published in Solid State Communications, Vol. 17, pp. 1193-1196, 1975, toward the end of reducing the localized states in the energy gap in amorphous silicon or germanium to make the same approximate more closely intrinsic crystalline silicon or germanium and or substitutionally doping the amorphous materials with suitable classic dopants, as in doping crystalline materials, to make them extrinsic and or p or n conduction types.

The reduction of the localized states was accomplished by glow discharge deposition of amorphous silicon films wherein a gas of silane ($SiH_4$) was passed through a reaction tube where the gas was decomposed by an radio frequency (RF) glow discharge and deposited on a substrate at a substrate temperature of about 500°–600° K. (227°–327° C.). The material so deposited on the substrate was an intrinsic amorphous material consisting of silicon and hydrogen. To produce a doped amorphous material a gas of phosphine ($PH_3$) for n-type conduction or a gas of diborane ($B_2H_6$) for p-type conduction were premixed with the silane gas and passed through the glow discharge reaction tube under the same operating conditions. The gaseous concentration of the dopants used was between about $5 \times 10^{-6}$ and $10^{-2}$ parts per volume. The material so deposited including supposedly substitutional phosphorus or boron dopant and was shown to be extrinsic and of n or p conduction type.

While it was not known by these researchers, it is now known by the work of others that the hydrogen in the silane combines at an optimum temperature with many of the dangling bonds of the silicon during the glow discharge deposition, to substantially reduce the density of the localized states in the energy gap toward the end of making the electronic properties of the amorphous material approximate more nearly those of the corresponding crystalline material.

The incorporation of hydrogen in the above RF deposition method not only has limitations based upon the fixed ratio of hydrogen to silicon in silane, but, more importantly, various Si:H bonding configurations introduce new antibonding states which can have deleterious consequences in these materials. Therefore, there are basic limitations in reducing the density of localized states in these materials which are particularly harmful in terms of effective p as well as n doping. The resulting density of states of the RF silane deposited materials leads to a narrow depletion width, which in turn limits the efficiencies of solar cells and other devices whose operation depends on the drift of free carriers. The RF method of making these materials by the use of only silicon and hydrogen also results in a high density of surface states which affects all the above parameters.

After the development of the glow discharge deposition of silicon from silane gas was carried out, work was done on the sputter depositing of amorphous silicon films in the atmosphere of a mixture of argon (required by the sputtering deposition process) and molecular hydrogen, to determine the results of such molecular hydrogen on the characteristics of the deposited amorphous silicon film. This research indicated that the hydrogen acted as an altering agent which bonded in such a way as to reduce the localized states in the energy gap. However, the degree to which the localized states in the energy gap were reduced in the sputter deposition process was much less than that achieved by the silane deposition process described above. The above described p and n dopant gases also were introduced in the sputtering process to produce p and n doped materials. These materials had a lower doping efficiency than the materials produced in the glow discharge process. Neither process produced efficient p-doped materials with sufficiently high acceptor concentrations for producing commercial p-n or p-i-n junction devices. The n-doping efficiency was below desirable acceptable commercial levels and the p-doping was particularly undesirable since it reduced the width of the band gap and increased the number of localized states in the band gap.

Greatly improved amorphous silicon alloys having significantly reduced concentrations of localized states in the energy gaps thereof and high quality electronic properties have been prepared by glow discharge as fully described in U.S. Pat. No. 4,226,898, Amorphous Semiconductors Equivalent to Crystalline Semiconductors, Stanford R. Ovshinsky and Arun Madan which issued Oct. 7, 1980, and by vapor deposition as fully described in U.S. Pat. No. 4,217,374, Stanford R. Ovshinsky and Masatsugu Izu, which issued on Aug. 12, 1980, under the same title. As disclosed in these patents, which are incorporated herein by reference, fluorine is introduced into the amorphous silicon semiconductor to substantially reduce the density of localized states therein. Activated fluorine especially readily diffuses into and bonds to the amorphous silicon in the amorphous body to substantially decrease the density of localized defect states therein, because the small size of the fluorine atoms enables them to be readily introduced into the amorphous body. The fluorine bonds to the dangling bonds of the silicon and forms what is believed to be a partially ionic stable bond with flexible bonding angles, which results in a more stable and more efficient compensation or alteration than is formed by hydrogen and other compensating or altering agents. Fluorine is considered to be a more efficient compensating or altering element than hydrogen when employed alone or with hydrogen because of its exceedingly small size, high reactivity, specificity in chemical bonding, and highest electronegativity. Hence, fluorine is qualitatively different from other halogens and so is considered a super-halogen.

As an example, compensation may be achieved with fluorine alone or in combination with hydrogen with the addition of these element(s) in very small quantities (e.g., fractions of one atomic percent). However, the amounts of fluorine and hydrogen most desirably used are much greater than such small percentages so as to form a silicon-hydrogenfluorine alloy. Such alloying amounts of fluorine and hydrogen may, for example, be in the range of 1 to 5 percent or greater. It is believed that the new alloy so formed has a low density or defect states in the energy gap than that achieved by the mere neutralization of dangling bonds and similar defect states. Such larger amount of fluorine, in particular, is believed to participate substantially in a new structural configuration of an amorphous silicon-containing material and facilitates the addition of other alloying materials, such as germanium. Fluorine, in addition to its other characteristics mentioned herein, is believed to be an organizer of local structure in the silicon-containing alloy through inductive and ionic effects. It is believed that fluorine also influences the bonding of hydrogen by acting in a beneficial way to decrease the density of defect states which hydrogen contributes while acting as a density of states reducing element. The ionic role that fluorine plays in such an alloy is believed to be an important factor in terms of the nearest neighbor relationships.

About forty-five years ago, C. Carlson developed the first electrophotographic process based on a sulfur material. Other chalcogenides such as selenium and selenium alloys were thereafter suggested for such applications together with organic substances such as polyvinyl carbazole (PVK). These materials, however, exhibited certain deficiencies. They were toxic, and therefore difficult to handle, soft, and therefore subject to wear, and had poor infrared light photoresponse.

In view of the above noted deficiencies of these materials, silicon based amorphous semiconductor alloys were investigated for possible applications in electrophotographic processes. These materials were considered likely to be useful because of the hardness of amorphous silicon alloys, because of their nontoxic nature, and because of their improved photoresponse to infrared light. Also, as previously mentioned, these materials could be made with a density of states reduced to a point where charging of the materials to the potentials required for electrophotographic replication was considered possible. Thus, amorphous semiconductor alloys made by the processes hereinabove described have demonstrated photoresponsive characteristic which are suited for electrophotographic applications.

It has been suggested to utilize the RF generated alloys in photoconductive members with a bottom and a top blocking layer. The photoconductive members need to be on the order of 15 microns thick for the members to be charged to a sufficient saturation voltage, to be practical, about 350 volts. The prior art RF processes however have suffered from relatively slow deposition rates on the order of 10 Angstroms or less per second and low utilization of the reaction gas feed stock which are important considerations from the standpoint of making the photoconductive members from these materials on a commercial basis. If the deposition rate is increased above about 10 Angstroms per second, such as by increasing the RF power applied, then deleterious powder and/or polymers are formed and incorporated in the alloys.

Applicants in the parent application, U.S. Ser. No. 580,081, have discovered a new and improved process for making photoconductive amorphous semiconductor alloys and members and improved device structures. The process therein provides substantially increased deposition rates and reaction gas conversion efficiencies without formation of polymers or powder, so as to be commercially viable. The parent application also can provide a top blocking layer with enhanced electrophotographic performance.

Applicants herein have discovered an improved microwave glow discharge deposition process for making semiconductor alloys. Most preferably, relatively thick photoconductive semiconductor alloys and members and improved device structures can be formed in accordance with the invention. The alloys, members and structures are formed while controlling the ion bombardment of the depositing material.

SUMMARY OF THE INVENTION

The present invention provides an improved microwave system and process for making semiconductor alloys and most particularly relatively thick photoconductive alloys and members at a commercially viable reaction gas conversion efficiency and deposition rate. Further, photoconductive members can be formed which have an enhanced top blocking layer. The photoconductive members can be formed to be positively or negatively charged.

In accordance with the invention, the process includes providing a source of microwave energy, coupling the microwave energy into a substantially enclosed reaction vessel which contains a substrate onto which the semiconductor alloys are deposited. The alloys are deposited from a reaction gas which includes at least one semiconductor element to be deposited. The microwave energy and the reaction gas form a glow discharge plasma within the vessel to deposit a semiconductor alloy from the reaction gas onto the substrate. The microwave energy forms molecular ions and depositing molecular species of the semiconductor element and the plasma potential is controlled to alter the ion bombardment of the depositing species.

The reaction gas can include silane ($SiH_4$), silicon tetrafluoride ($SiF_4$), boron trifluoride ($BF_3$), diborane ($B_2H_6$), phosphine ($PH_3$), hydrogen ($H_2$), germanium tetrafluoride ($GeF_4$) and germane ($GeH_4$) and combinations thereof. A positive charge type photoconductive member can be formed by depositing a first blocking layer onto the substrate to prevent electron injection from the substrate into the photoconductive layer. The blocking layer is formed of a p-type amorphous or microcrystalline silicon alloy with hydrogen and/or fluorine on the order of 50 Angstroms to one micron thick. A second photoconductive layer is formed on the blocking layer of substantially intrinsic or slightly $\pi$-type amorphous silicon alloy with hydrogen and/or fluorine on the order of 10 to 25 microns thick. A top blocking layer is formed on the photoconductive layer, which is formed of a generally insulating alloy to provide a mechanically hard surface. The top layer principally provides chemical resistance to moisture and temperature effects to provide the member with improved stability. The top layer is formed of an alloy of silicon, hydrogen and/or fluorine and at least one of carbon, nitrogen or oxygen on the order of 50 to 1000 Angstroms thick. The top layer can be formed with the addition of oxygen ($O_2$), methane ($CH_4$), ammonia ($NH_3$) or nitrogen ($N_2$).

A negative charge type photoconductive member can be formed by depositing a first blocking layer onto the substrate to prevent hole injection from the substrate into the photoconductive layer. The blocking layer is formed of an n-type amorphous or microcrystalline silicon alloy with hydrogen and/or fluorine on the order of 50 Angstroms to one micron thick. A second photoconductive layer is formed on the blocking layer of substantially intrinsic or slightly n-type amorphous silicon alloy with hydrogen and/or fluorine on the order of 10 to 25 microns thick. A top layer is formed on the photoconductive layer to provide the previously mentioned features. The top alloy layer can be formed in the same manner as the positive charge type layer, also on the order of 50 to 1000 Angstroms thick.

A top blocking enhancement layer can be added before the top layer in either the positive or negative type charge member by depositing a high quality, low defect density amorphous alloy with a density of states at the Fermi level g ($E_f$) of less than or equal to $10^{16}/cm^3eV$ from a radio frequency (RF) glow discharge. The enhancement layer is formed of a substantially intrinsic alloy for the positive charge type members and a substantially intrinsic alloy for the negative charge type members. Either type layer is formed from an amorphous alloy of silicon, hydrogen and/or fluorine on the order of a depletion width, about 1000 to 4000 Angstroms, in thickness.

DESCRIPTION OF THE PREFERRED EMBODIMENTS

Figure 1:
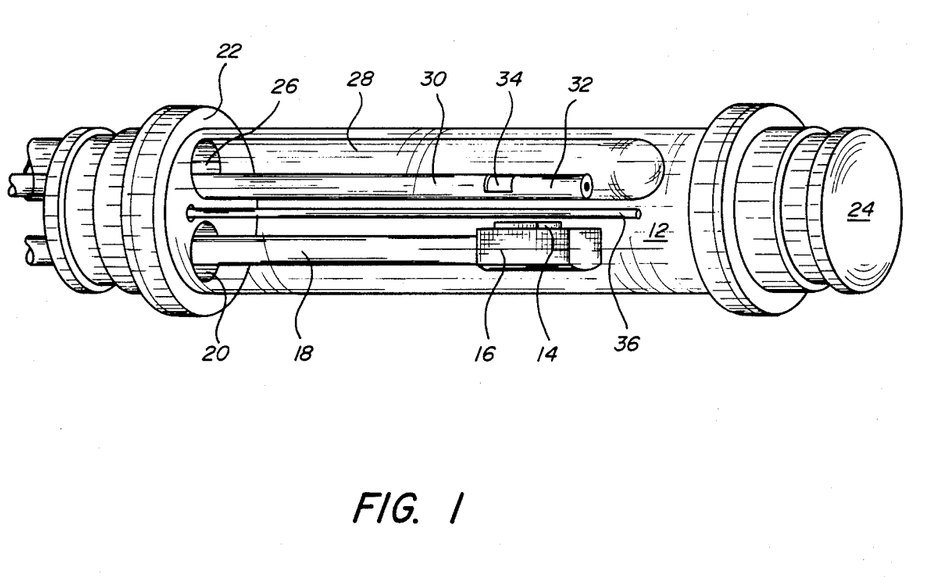
FIG. 1 is a perspective view, partly broken away, of a microwave plasma deposition system for depositing semiconductor alloys and members in accordance with the process of the invention.

Referring now more particularly to FIG. 1, a microwave deposition apparatus suitable for practicing the process of the present invention, is generally designated 10. The apparatus 10 includes a transparent tubular chamber or reaction vessel 12 containing a substrate 14 upon which the semiconductor alloys are to be deposited. The substrate 14 is mounted on a substrate holder 16 which is mounted on a rod or shaft 18. The substrate holder 16 can include appropriate heater and control means (not illustrated) for controlling the temperature of the substrate 14. The shaft 18 is sealingly passed through an opening 20 in an end cap 22. The opposite end of the chamber 12 is sealed by a second end cap 24. The end cap 24 serves to seal the chamber 12 and to evacuate the reaction gases (not shown), while the end cap 22 provides the opening 20 for the substrate holder 16 and openings for the introduction of reaction gases (not shown) and an opening 26 for an antenna tube 28.

The antenna tube 28 can be formed of glass or quartz and encloses a microwave antenna 30. The antenna 30 includes an end piece 32 which is coupled to the microwave power and is terminated by a gap 34, about one-half wave-length from the end of the antenna 30. The antenna 30 can be of the type disclosed in U.S. application Ser. No. 441,280, now U.S. Pat. No. 4,515,107, entitled "An Improved Apparatus For The Manufacture Of Photovoltaic Devices", filed in the names of Eugene Fournier and Joachim Doehler on Nov. 12, 1982, which is incorporated herein by reference. The antenna system can also be of the type disclosed in U.S. application Ser. No. 423,424, now U.S. Pat. No. 4,517,223, entitled "Method Of Making Amorphous Semiconductor Alloys And Devices Using Microwave Energy", filed in the names of Stanford R. Ovshinsky, David D. Allred, Lee Walter and Stephen J. Hudgens on Sept. 24, 1982, which is also incorporated herein by reference.

A source of microwave energy is coupled to the antenna 30 which couples the energy into the reaction vessel 12. The combination of the reaction gases and the microwave energy from the antenna 30 causes the formation of a plasma in the area of the substrate 14, resulting in the deposition of a semiconductor alloy on the substrate. In accordance with the present invention, the reaction gases include molecules which contain at least one semiconductor element to form the plasma. The temperature of the substrate 14 is maintained about 250 degrees Centigrade and the frequency of the microwave energy is 500 Megahertz and above, one preferable frequency being about 2.45 Gigahertz. As mentioned, the combined microwave energy and the reaction gas form the plasma to permit the deposition process to proceed.

In operation, the system 10 is first pumped down to below a desired deposition pressure, such as $10^{-5}$ Torr. The reaction gases such as silicon tetrafluoride ($SiF_4$), silane ($SiH_4$), germanium tetrafluoride ($GeF_4$), germane ($GeH_4$), hydrogen ($H_2$), boron trifluoride ($BF_3$), diborane ($B_2H_6$), phosphine ($PH_3$), oxygen ($O_2$), methane ($CH_4$), nitrogen ($N_2$), ammonia ($NH_3$) or combinations thereof, are fed into the vessel 12 through the end cap 22. The vessel 12 is brought up to the desired operating pressure of, for example, 0.05 Torr.

The microwave energy from the antenna 30 then is directed into the vessel 12 to form the plasma in the area of the substrate 14 to deposit the semiconductor alloy onto the substrate 14. The output power of the microwave energy source is adjusted preferably to about 0.1 to 1 watt per cubic centimeter in power density. The flow rate of the reaction gases can be between 10 to 60 SCCM. With the foregoing system parameters, deposition rates of at least 100 Angstroms per second can be obtained. Even at these high deposition rates, the deposited semiconductor films exhibit high quality photoresponsive characteristics suitable for electrophotographic applications.

In utilizing the microwave deposition process of the invention to form relatively thick semiconductor alloys (ten microns or greater) such as switches and electrophotographic members, stress in the deposited alloys must be controlled. Applicants have discovered, since microwave energy is applied to the process through an antenna and not an electrode, that the self bias of the depositing film is not significant which results in very small values of ion bombardment flux from the plasma. It was further discovered that controlling the plasma potential provides control of the ion bombardment of the depositing species, which dramatically improves device performance. The plasma potential can be controlled by utilizing a probe 36 which is coupled to a potential with respect to the system ground (not illustrated) to provide an external bias to the system 10. The subsequent controlled ion bombardment allows the structure of the alloy to be altered to provide a substantial improvement in the deposited alloy characteristics. The spacing and dimensions of the probe 36 are not critical and the probe 36 is located adjacent the substrate coextensive with the plasma. The probe can be formed, for example, from stainless steel and the bias can be in the form of an AC, DC or RF potential.

The microwave plasma produces depositing species, mostly molecular free radicals, and molecular ions of the semiconductor element in the reaction gas. The ratio of the ion flux to the depositing species flux can be controlled by controlling the plasma potential. Preferably the ratio of the ion flux to the depositing species flux is controlled to be in the range of 0.1 to 0.0001, most preferably about 0.001. The controlled ion bombardment provides a substantially columnar structure which is highly stress relieved and can be utilized to form a substantially improved relatively thick photoconductive member with substantially improved xerographic characteristics. The effect of controlling the plasma potential on the saturation surface potential of positive corona charged twenty-five micron thick multilayered electrophotoconductive members is shown by the following examples:

| Example No. | Bias Voltage (volts) | Bias Current (ma) | $V_{sat}$ (volts) |
|---|---|---|---|
| 1 | 65 | 110 | 1330 |
| 2 | 57 | 105 | 555 |
| 3 | 50 | 95 | 20 |
| 4 | 40 | 80 | 0 |
| 5 | 0 | 0 | 0 |

Figure 2:
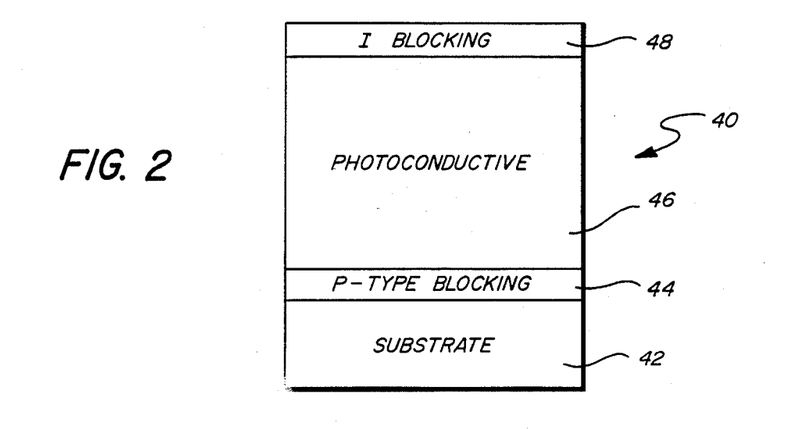
FIG. 2 is a fragmentary sectional view of a positive charge type embodiment of a photoconductive member to illustrate one application of the semiconductor alloys made by the process of the invention.

A large number of members were deposited with the conditions about the same as Example 1. These results are still unoptimized; however, the saturation voltage ($V_{sat}$) ranged from 1100 to 1400 volts, giving rise to charge acceptance of 44 to 56 volts/micron of member thickness. Example No. 5 was so stressed that it had cracks in the material. The relationship of the material quality and plasma potential to stress was further illustrated by applying a mechanical dilation to a curved member with a high $V_{sat}$. Applying a relative dilation of about $4 \times 10^{-6}$, expressed as a ratio of the change in length of the member to the original length of the member, reduced $V_{sat}$ about twenty percent, which loss was recovered after the mechanical dilation was released. The member examples were constructed as illustrated in FIG. 2 with a microcrystalline p-type bottom blocking layer of Si:F:H:B about 1000 Angstroms thick, followed by a $\pi$-type photoconductive layer of Si:F:H:B about 25 microns thick, and a top layer of Si:F:H:C about 1000 Angstroms thick.

One of the critical factors in making the high quality alloys at deposition rates of 100 Angstroms per second and greater is the low operating pressure. The operating pressure of 0.05 Torr is about an order of magnitude below a conventional RF deposition pressure of 0.5 Torr.

Even at the deposition rate of 100 Angstroms per second, the alloys do not contain deleterious amounts of polymer or powder inclusions. Attempts to deposit these semiconductor alloys with a high RF deposition rate of greater than 10 Angstroms per second, but below even 20 Angstroms per second, leads to very poor quality alloys with large polymer $(SiH_2)_n$ and/or power inclusions.

For commercially viable photoconductive members to be manufactured, the deposition time and the amount of materials utilized must be minimized. Clearly, a deposition rate of ten times or greater that of the RF rate provides an enormous economic advantage. Further, the reaction gas conversion efficiency is also dramatically different for the microwave process of the present invention than for the prior art RF deposition process. A typical RF process is much less efficient in converting and depositing the reaction gas and typically converts on the order of ten percent of the reaction gas into the amorphous silicon alloy. The microwave process of the present invention in dramatic contrast converts substantially one-hundred percent of the reaction gases into depositing species. This provides another enormous economic advantage in depositing the thicknesses of semiconductor alloy which are necessary to have a practical photoconductive member or device.

FIG. 2 illustrates a first positive charge type electrophotoconductive member or device 40, which includes a substrate 42, a first p-type blocking layer 44, a photoconductive layer 46 and a top blocking layer 48. The substrate 42 can be formed of any convenient material which is either conductive, such as a metal, or has a conductive coating formed thereon, such as glass or a polymer. The first or bottom blocking layer 44 is formed of a p-type microcrystalline or amorphous silicon, hydrogen and/or fluorine alloy. The device 40 in such a configuration is a positively charged device and the layer 44 prevents electron injection from the substrate 42 into the photoconductive layer 46.

The blocking layer 44 preferably is formed from a reaction gas mixture of $SiH_4$ and $BF_3$ in $H_2$ or $SiH_4$ and/or $SiF_4$ and $BF_3$ in $H_2$. The blocking layer 44 is formed to create an alloy with a high p-type conductivity and an activation energy ($\Delta E$) of about 0.02 eV. One preferable combination to form a microcrystalline layer 44 is 75 SCCM of 1000 ppm $SiH_4$ in $H_2$, 0.15 SCCM of 10.8 percent $BF_3$ in $H_2$ and 45 SCCM of $H_2$. The layer 44 preferably is deposited with an effective power density in the range of 0.1 to 1.0 watts per cubic centimeter, and preferably about 0.7 watts per cubic centimeter. In the system 10, a bias of about 80 volts and 160 ma is applied to the probe 36 to deposit the layer 44 at 20 Angstroms per second. The layer 44 preferably is from 50 Angstroms to one micron thick. Further details of the preferable microcrystalline bottom blocking layer are provided in U.S. Ser. No. 729,701, filed May 2, 1985, entitled "Improved Electrophotographic Photoreceptor And Method For The Fabrication Thereof" in the names of Annette Johncock and Stephen J. Hudgens, which is incorporated herein by reference.

The photoconductive layer 46 preferably also is deposited with an effective power density in the range of 0.1 to 1.0 watts per cubic centimeter, and preferably about 0.7 watts per cubic centimeter. At least this thick layer of the device 40 would be deposited utilizing the ion bombardment control of the present invention. The layer 46 preferably is deposited to a thickness of 10 to 25 microns to form an overall thickness of the alloy layers of at least 10 to 25 microns. The 10 micron thickness is to ensure a saturation voltage of about 350 volts. The photoconductive alloy can sustain an electric field of up to about 35 to 70 volts per micron of thickness. The layer 46 preferably is formed from a reaction gas mixture of $SiH_4$ or $SiH_4$ and/or $SiF_4$ with a small amount of p-type dopant to form a substantially intrinsic or slightly $\pi$-type alloy. The alloy with no dopant is slightly n-type exhibiting a $\Delta E$ of 0.7 eV. The addition of the small amount of p-type dopant changes $\Delta E$ to about 1.0 eV. One preferable combination is 30 parts $SiH_4$, 7 parts $SiF_4$ and 0.1 parts of a mixture of 1800 ppm of $BF_3$ in $SiH_4$. A second preferable combination is 30 parts $SiH_4$ and 0.1 parts of a mixture of 1800 ppm of $BF_3$ in $SiH_4$.

The top blocking layer 48 is formed to provide a very hard surface as compared to any chalcogenide, for example Se or $Se_{92}Te_8$. The layer 48 is chemically resistant to moisture and temperature effects to provide the member with improved stability. The layer has a band gap of greater than 2.0 eV. The layer 48 preferably is formed from a reaction gas mixture of $SiH_4$ or $SiH_4$ and/or $SiF_4$ and at least one of oxygen, carbon or nitrogen. One preferable combination is 30 parts $CH_4$ and 4 parts $SiH_4$. A second preferable combination is 30 parts $CH_4$, 2 parts $SiH_4$ and 2 parts $SiF_4$. An oxide blocking layer of $SiO_2$ can be formed from 1 part $H_2$ and 5 parts of 5 percent $O_2$ in $SiF_4$. The oxide layer can be deposited at a power density of 0.34 watts per cubic centimeter, and a substrate temperature of 350° C. at about 48 Angstroms per second. A nitride blocking layer also can be formed from $N_2$ or $NH_3$ in $SiF_4$ or $SiH_4$. The layer 48 is deposited at a power density in the range of 0.2 to 1.2 watts per cubic centimeter and preferably is from 50 to 1000 Angstroms thick.

The layers 44 and 46 are deposited at 100 Angstroms per second or greater, which as mentioned above is at least ten times the deposition rate of prior art methods. Essentially one hundred percent of the reaction gas can be utilized which is also significantly greater than the prior art utilization percentage of about ten percent. The top layer 48 is deposited at a somewhat slower rate of about 30 Angstroms per second which is still much greater than the RF deposition rate of the prior art.

Figure 3:
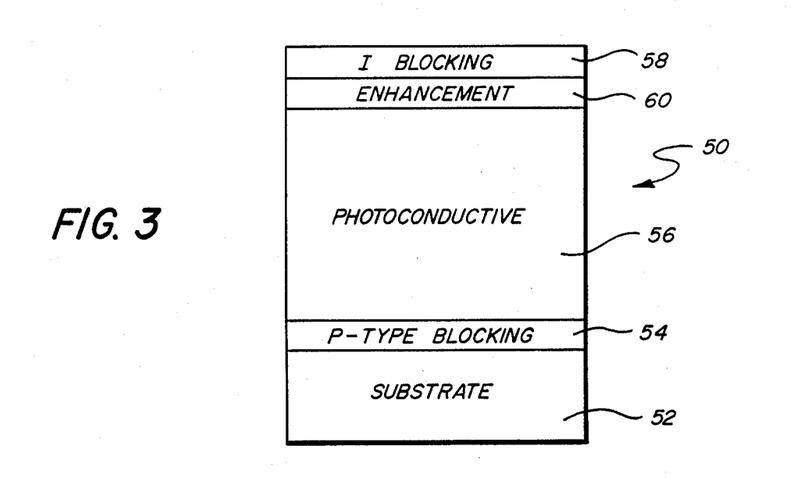
FIG. 3 is a fragmentary sectional view of a positive charge type photoconductive member which has an enhanced top blocking layer made by the process of the invention.

FIG. 3 illustrates another positive charge type photoconductive member embodiment 50 which has an enhanced top blocking layer. A substrate 52, a bottom p-type blocking layer 54, a photoconductive layer 56 and a top blocking layer 58 are provided which are essentially the same as the similarly described layers in FIG. 2. An enhanced top blocking layer 60 is deposited before the layer 58. Although the microwave deposition provides a high quality alloy layer, it can contain more defects than a properly deposited RF layer. The layer 60 is then deposited by a conventional RF plasma to provide a high quality layer with a density of states which is lower than the microwave deposited photoconductive layer 56. The RF layer 60 enhances the layer 58, because the lower density of states provides greater band bending and thus better charge retention, dark decay characteristics and freedom from fatiguing effects due to repeated light exposure and exposure due to certain atmospheric species which have been reported to reduce device performance. The effective overall deposition rate and reaction gas utilization is not lowered too significantly, since the layer 60 preferably is on the order of a depletion width thick, generally 1000 to 4000 Angstroms. The layer 60 can be deposited from the same reaction gas mixture as the photoconductive layer 56. At least the layer 56 would be deposited utilizing the ion bombardment control of the present invention.

Figure 4:
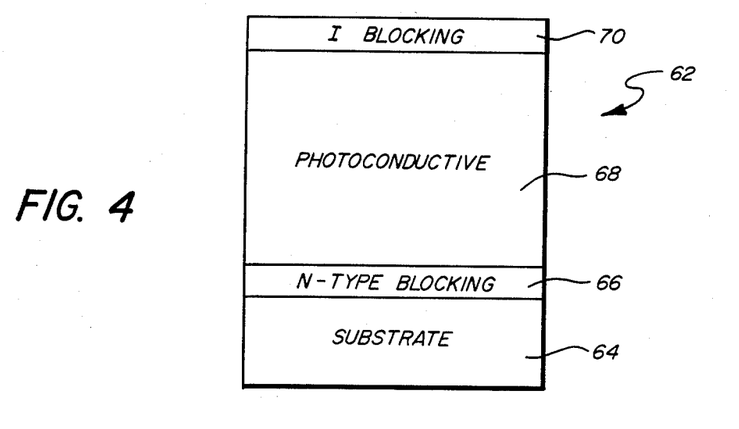
FIG. 4 is a fragmentary sectional view of a negative charge type embodiment of a photoconductive member to illustrate another application of the semiconductor alloys made by the process of the invention.
Figure 5:
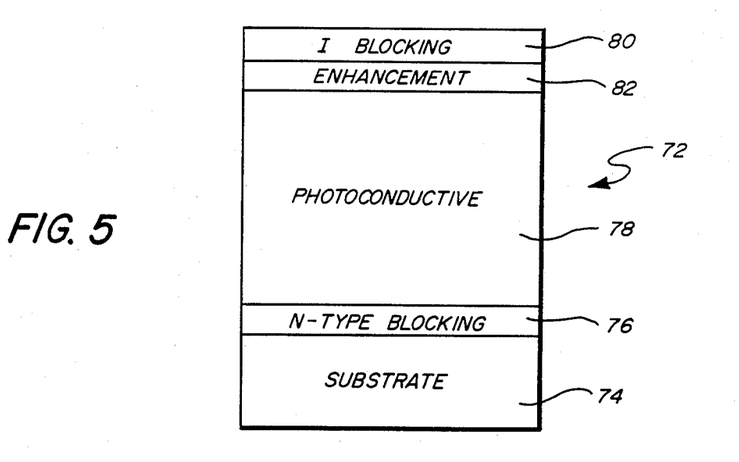
FIG. 5 is a fragmentary sectional view of a negative charge type photoconductive member which has an enhanced top blocking layer made by the process of the invention.

Although some conventional photoconductive members, such as Se based drums, are positive charge type devices, the amorphous photoconductive alloy members of the present invention are particularly suitable to be utilized as negative charge type devices, as well. The product of the electron mobility and tau, the electron recombination lifetime, of these alloys is greater in the undoped alloy material than that of the holes and thus unlike the chalcogenide based systems, these alloys can operate in either the positive or negative charge type configurations. FIGS. 4 and 5 are directed to negative charge type devices or members.

FIG. 4 illustrates a first negative charge type photoconductive member or device 62, which includes a substrate 64, a first n-type blocking layer 66, a photoconductive layer 68 and a top blocking layer 70. The substrate 64 again can be formed of any convenient material which is either conductive, such as a metal, or has a conductive coating formed thereon, such as glass or a polymer. The first or bottom blocking layer 66 is formed of an n-type amorphous or microcrystalline silicon, hydrogen and/or fluorine alloy. The device 62 in such a configuration is a negatively charged device and the layer 66 prevents hole injection from the substrate 64 into the photoconductive layer 68. Again, at least the layer 68 would be deposited utilizing the ion bombardment control of the invention.

The blocking layer 66 preferably is a microcrystalline layer formed from a reaction gas mixture of $SiH_4$ and $PH_3$ in $H_2$ or $SiH_4$ and/or $SiF_4$ and $PH_3$ in $H_2$. One preferable combination is 75 SCCM of 1000 ppm $SiH_4$ in $H_2$, 15 SCCM of 10.8 percent $PH_3$ in $H_2$ and 45 SCCM of $H_2$. The layer 66 preferably is deposited with an effective power density in the range of 0.1 to 1.0 watts per cubic centimeter, and preferably about 0.7 watts per cubic centimeter. Again, in the system 10, a bias of about 80 volts and 160 ma is applied to the probe 36 to deposit the layer 66. The layer 66 preferably is from 50 Angstroms to one micron thick. The layer has a high n-type $\Delta E$ of 0.02 eV. The most preferable microcrystalline blocking layer 66 again is formed as disclosed in U.S. Ser. No. 729,701.

The photoconductive layer 68 preferably also is deposited with an effective power density in the range of 0.1 to 1.0 watts per cubic centimeter and preferably about 0.7 watts per cubic centimeter. The layer 68 preferably is deposited to a thickness of from 10 to 25 microns to form an overall thickness of the alloy layers of at least 10 to 25 microns. The 10 micron thickness is to ensure a saturation voltage of at least 350 volts. The alloy can sustain an electric field of up to about 35 to 70 volts per micron of thickness. The layer 68 preferably is formed from a reaction gas mixture of $SiH_4$ or $SiH_4$ and/or $SiF_4$ to form an intrinsic alloy with a $\Delta E$ of about 0.7-0.9 eV (the intrinsic alloy is slightly n-type). One preferable combination is 30 parts $SiH_4$ and 7 parts $SiF_4$. A second preferable combination is 20 parts $SiH_4$.

The top blocking layer 70 again is formed to provide stability of charging characteristics and a very hard surface as compared to any chalcogenide, for example Se or $Se_{92}Te_8$. The layer 70 again is chemically resistant to provide an improved member stability and has a band gap greater than 3.0 eV. The blocking layer 70 can be formed from a reaction gas mixture of $SiH_4$ or $SiH_4$ and/or $SiF_4$ and at least one of oxygen, carbon or nitrogen. One preferable combinacombination is 30 parts $CH_4$ and 4 parts $SiH_4$ A second preferable combination is 30 parts $CA_4$, and 2 parts $SiF_4$. An oxide blocking layer of $SiO_2$ can be formed from 1 part $H_2$ and 5 parts of 5 percent $O_2$ in $SiF_4$. The oxide layer can be deposited with a power density of about 0.34 watts per cubic centimeter, a substrate temperature of 350° C. at about 48 Angstroms per second. A nitride blocking layer also can be formed from $N_2$ or $NH_3$ in $SiF_4$ or $SiH_4$. The layer 70 is deposited at an effective power density in the range of 0.1 to 1.0 watts per cubic centimeter and preferably is 50 to 1000 Angstroms thick.

The layers 66 and 68 are again deposited at 100 Angstroms per second or greater, which as mentioned above is at least ten times the deposition rate of prior art methods. At least the layer 68 will be deposited utilizing the ion bombardment control of the invention. Again, approximately one hundred percent of the reaction gas can be utilized which is also significantly greater than the prior art utilization percentage of approximately ten percent. The top layer 70 is deposited at a somewhat slower rate of about 30 Angstroms per second which is still much greater than the RF deposition rate of the prior art.

FIG. 5 illustrates another negative charge type photoconductive member embodiment 72 which has an enhanced top blocking layer, similar to the member 50. A substrate 74, a bottom n-type blocking layer 76, a photoconductive layer 78 and a top blocking layer 80 are provided which are essentially the same as the similarly described layers in FIG. 3. An enhanced top blocking layer 82 is deposited before the blocking layer 80. As described above, although the microwave deposition provides a high quality alloy layer, it can contain more defects because of the high deposition rate than a properly deposited RF layer. The layer 82 is then deposited by a conventional RF plasma to provide a high quality layer with a density of states which is lower than the microwave deposited photoconductive layer 78. The RF layer 82 enhances the blocking layer 80, because the lower density of states provides greater band bending and better charge retention, dark decay characteristics and freedom from fatiguing effects due to repeated light exposure and exposure due to certain atmospheric species which have been reported to reduce device performance. The effective overall deposition rate and reaction gas utilization is not lowered too significantly, since the layer 82 preferably is on the order of a depletion width thick, generally 1000 to 4000 Angstroms. The layer 82 can be deposited from the same reaction gas mixture as the photoconductive layer 78.

Modifications and variations of the present invention are possible in light of the above teachings. While the invention is particularly applicable to the formation of relatively thick semiconductor films such as for utilization in xerographic photoreceptors, light activated high voltage switches and the like, the invention also can be utilized in the formation by microwave glow discharge of other semiconductor alloy films for other device applications, such as thin film photovoltaic devices, image scanners, thin film diodes, etc. While a planar stationary substrate 14 has been described in FIG. 1, the photoconductive members can also be deposited on a drumshaped substrate when desired. The rod or shaft 18 then can be rotated to coat the outside of the drum or cylinder. A most preferable system and method of depositing on one or more drums is disclosed in U.S. Ser. No. 580,086, filed Feb. 14, 1984, entitled "Method And Apparatus For Making Electrophotographic Devices", in the names of Eugene Fournier, et al., which is incorporated herein by reference. The bottom blocking layers do not have to be amorphous and can be, for example, polycrystalline. (By the term "amorphous" is meant an alloy or material which has long range disorder, although it may have short or intermediate order or even contain at times some crystalline inclusions.) It is therefore, to be understood that within the scope of the appended claims the invention may be practiced otherwise than as specifically described.

What is claimed and desired to be secured by Letters Patent of the United States is:

1. An improved method of forming a semiconductor member, comprising:
    providing a substrate;
    providing a source of microwave energy;
    providing a substantially enclosed reaction vessel and placing said substrate into said vessel;
    introducing into said vessel at least one reaction gas, including at least one semiconductor element to be deposited;
    Providing an operating pressure about an order of magnitude below a conventional RF deposition pressure;
    coupling said microwave energy into said vessel to form a plasma in said vessel from said reaction gas, including forming depositing species, primarily free radicals, from the semiconductor element and forming molecular ions of the semiconductor element; and
    depositing a semiconductor alloy member onto said substrate from said depositing species while controlling the plasma potential to alter ion bombardment of the depositing species, controlling said plasma potential including applying an external electrical bias to said substrate, said bias external to and separate from said substrate.

2. The method as defined in claim 1 wherein said ions and said depositing species each have a flux and controlling said plasma potential includea controlling the ratio of the ion flux to the depositing species flux.

3. The method as defined in claim 2 wherein said ratio ia controlled to be in the range of 0.1 to 0.0001.

4. The method as defined in claim 3 wherein said ratio is controlled to be about 0.001.

5. The method as defined in claim 1 including forming a photoconductive member.

6. The method as defined in claim 1 wherein said reaction gas contains at least silicon.

7. The method as defined in claim 1 wherein said reaction gas contains at least hydrogen.

8. The method as defined in claim 7 wherein said reaction gas further contains at least fluorine.

9. The method as defined in claim 1 wherein said reaction gas contains at least fluorine.

10. The method as defined in claim 5 including forming a xerographic photoreceptor member, wherein depositing said member includes depositing a first blocking layer onto said substrate by adding at least one dopant to said reaction gas and then depositing a second photoconductive layer onto said layer without a substantial amount of dopant therein, at least said photoconductive layer being deposited while controlling said plasma potential, and including depositing a third blocking layer onto said second photoconductive layer.

11. The method as defined in claim 10 including depositing a blocking enhancement layer onto said second layer before said third blocking layer.

12. The method as defined in claim 11 including depositing about a depletion width of said blocking enhancement layer as a substantially intrinsic alloy.

13. The method as defined in claim 1 wherein said substrate forms part of a waveguide for said microwave energy.

14. An improved method of forming a semiconductor member, comprising:
    providing a substrate;
    providing a source of microwave energy;
    providing a substantially enclosed reaction vessel and placing said substrate into said vessel;
    introducing into said vessel at least one reaction gas, including at least one semiconductor element to be deposited;
    providing an operating pressure about an order of magnitude below a conventional RF deposition pressure;
    coupling said microwave energy into said vessel to form a plasma in said vessel from said reaction gas, including forming depositing species, primarily free radicals, from the semiconductor element and forming molecular ions of the semiconductor element;
    depositing a semiconductor alloy member onto said substrate from said depositing species while controlling the plasma potential to alter ion bombardment of the depositing species, controlling said plasma potential including applying an external electrical bias to said substrate, said bias external to and separate from said substrate; and
    including forming a xerographic photoreceptor member, wherein depositing said member includes depositing a first blocking layer onto said substrate by adding at least one dopant to said reaction gas and then depositing a second photoconductive layer onto said layer without a substantial amount of dopant therein, at least said photoconductive layer being deposited while controlling said plasma potential, including depositing a third blocking layer onto said second photoconductive layer and including depositing a blocking enhancement layer onto said second layer before said third blocking layer.

15. The method as defined in claim 14 wherein said ions and said depositing species each have a flux and controlling said plasma potential includes controlling the ratio of the ion flux to the depositing species flux.

16. The method as defined in claim 15 wherein said ratio is controlled to be in the range of 0.1 to 0.0001.

17. The method as defined in claim 16 wherein said ratio is controlled to be about 0.001.

18. The method as defined in claim 14 including depositing about a depletion width of said blocking enhancement layer as a substantially intrinsic alloy.

* * * * *